United States Patent
Lee et al.

(10) Patent No.: US 9,536,819 B2
(45) Date of Patent: Jan. 3, 2017

(54) TRANSPARENT SUBSTRATE HAVING NANO PATTERN AND METHOD OF MANUFACTURING THE SAME

(71) Applicant: LG INNOTEK CO., LTD., Seoul (KR)

(72) Inventors: Jun Lee, Seoul (KR); Kyoung Jong Yoo, Seoul (KR); Young Jae Lee, Seoul (KR); Jin Su Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 129 days.

(21) Appl. No.: 14/358,701

(22) PCT Filed: Dec. 11, 2012

(86) PCT No.: PCT/KR2012/010739
§ 371 (c)(1),
(2) Date: May 15, 2014

(87) PCT Pub. No.: WO2013/094918
PCT Pub. Date: Jun. 27, 2013

(65) Prior Publication Data
US 2014/0272316 A1    Sep. 18, 2014

(30) Foreign Application Priority Data

Dec. 19, 2011    (KR) .................... 10-2011-0137217

(51) Int. Cl.
*H01L 23/498* (2006.01)
*H05K 1/03* (2006.01)
(Continued)

(52) U.S. Cl.
CPC ......... *H01L 23/49894* (2013.01); *G03F 7/002* (2013.01); *H05K 1/036* (2013.01);
(Continued)

(58) Field of Classification Search
CPC ............ B32B 3/00; B32B 3/30; H05K 1/036; B82Y 30/00; B82Y 10/00; G03F 7/002; G02F 1/3338; G02F 1/1335; Y10T 428/24612; G06F 3/047; G06F 3/045; G06F 3/044; G06F 3/041; G06F 2203/04112; G06F 1/16; G06F 3/0412; G09G 5/006; H01L 23/49894
(Continued)

(56) References Cited

U.S. PATENT DOCUMENTS 6,501,529 B1    12/2002    Kurihara et al.
2004/0008506 A1    1/2004    Son
(Continued)

FOREIGN PATENT DOCUMENTS

CN    101159181 A    4/2008
CN    101276079 A    10/2008
(Continued)

OTHER PUBLICATIONS

Chinese Office Action issued in Application No. 201280021740.2 dated Jun. 3, 2015.
(Continued)

*Primary Examiner* — Catherine A Simone
(74) *Attorney, Agent, or Firm* — KED & Associates, LLP

(57) ABSTRACT

Provided are a transparent substrate having a nano pattern, and a method of manufacturing the same, which enables the nano pattern to be easily formed on the transparent substrate and has the nano pattern applicable to a large sized substrate by forming a resin layer made of transparent material on a transparent substrate; forming at least one or more unit pattern parts composed of a first pattern area and a second pattern area in which a plurality of grid patterns are formed, and a protrusion pattern formed between the first pattern
(Continued)

area and the second pattern area, on the resin layer; and forming a nanoscale metal layer on the protrusion pattern.

19 Claims, 5 Drawing Sheets

(51) Int. Cl.
 G03F 7/00 (2006.01)
 B82Y 30/00 (2011.01)
(52) U.S. Cl.
 CPC ....... B82Y 30/00 (2013.01); H01L 2924/0002 (2013.01); Y10T 428/24612 (2015.01)
(58) Field of Classification Search
 USPC .......................................... 428/156, 167, 172
 See application file for complete search history.

(56) References Cited

U.S. PATENT DOCUMENTS

| | | | |
|---|---|---|---|
| 2004/0140516 | A1 | 7/2004 | Yoshikawa et al. |
| 2004/0150782 | A1 | 8/2004 | Honda et al. |
| 2007/0097278 | A1 | 5/2007 | Rho et al. |
| 2008/0081155 | A1 | 4/2008 | Kaneda et al. ............... 428/172 |
| 2008/0117509 | A1 | 5/2008 | Hayashi et al. |
| 2008/0187719 | A1 | 8/2008 | Uchida |
| 2009/0027773 | A1 | 1/2009 | Kawakami |
| 2009/0045163 | A1 | 2/2009 | Lambertini et al. ............ 216/24 |
| 2009/0079976 | A1* | 3/2009 | Cunningham ........ B01L 3/5027 356/246 |
| 2010/0079381 | A1 | 4/2010 | Hayashi et al. |
| 2010/0225606 | A1 | 9/2010 | Sasaki et al. |
| 2011/0141037 | A1 | 6/2011 | Hwang et al. |
| 2011/0151215 | A1 | 6/2011 | Kobayashi |
| 2011/0187669 | A1 | 8/2011 | Abiru et al. |
| 2011/0192302 | A1 | 8/2011 | Selinidis |
| 2012/0050958 | A1 | 3/2012 | Sanford et al. |
| 2012/0160802 | A1 | 6/2012 | Kim et al. |
| 2014/0272316 | A1 | 9/2014 | Lee et al. |
| 2015/0055032 | A1 | 2/2015 | Kato et al. |

FOREIGN PATENT DOCUMENTS

| | | |
|---|---|---|
| CN | 101809046 A | 8/2010 |
| CN | 102046357 A | 5/2011 |
| EP | 2 511 798 A1 | 10/2012 |
| JP | 2002-341781 | 11/2002 |
| JP | 2003-198186 | 7/2003 |
| JP | 2004-070164 | 3/2004 |
| JP | 2006-078665 | 3/2006 |
| JP | 2008-096677 A | 4/2008 |
| JP | 2008-181113 A | 8/2008 |
| JP | 2008-243819 | 10/2008 |
| JP | 2008-294372 | 12/2008 |
| KR | 10-2008-0028035 A | 3/2008 |
| KR | 10-2011-0024892 A | 3/2011 |
| WO | WO 2013/039238 | 3/2013 |

OTHER PUBLICATIONS

European Search Report issued in Application No. 12860252.1 dated Jun. 29, 2015.
Taiwanese Office Action dated Jan. 6, 2015 issued in Application No. 101148093 with English translation).
International Search Report dated Mar. 29, 2013 issued in Application No. PCT/KR2012/010739.
Chinese Office Action dated Jun. 3, 2015 issued in Application No. 201280021740.2 (with English Translation).
Chinese Office Action dated May 10, 2016 issued in Application No. 201280021740.2 (with English Translation).
U.S. Office Action dated Jun. 15, 2016 issued in U.S. Appl. No. 14/506,406.
Japanese Office Action dated Sep. 13, 2016 issued in Application No. 2014-547095.
U.S. Final Office Action dated Nov. 2, 2016 issrued in pending U.S. Appl. No. 14/506,406.
U.S. Final Office Action dated Nov. 2, 2016 issued in pending U.S. Appl. No. 14/506,406.

* cited by examiner

TRANSPARENT SUBSTRATE HAVING NANO PATTERN AND METHOD OF MANUFACTURING THE SAME

TECHNICAL FIELD

This application is a U.S. National Stage Application under 35 U.S.C. §371 of PCT Application No. PCT/KR2012/010739, filed Dec. 11, 2012, which claims priority to Korean Patent Application No. 10-2011-0137217, filed on Dec. 19, 2011, in the Korean Intellectual Property Office, the entire contents of which are hereby incorporated by reference.

The present invention relates to a technical field for forming a nano pattern, and more specifically, to a transparent substrate having a nano pattern.

BACKGROUND ART

When manufacturing a semiconductor device, a word line, it is necessarily required to implement various fine patterns such as a digit line, a contact and the like. A lithograph technology has been generally applied to form these fine patterns.

A contact lithograph method which has been traditionally and widely used enables the pattern to be formed throughout a wide area. However, due to a limit of the diffraction of light, it was problematic that a pitch of the fine pattern which can be formed is limited (1~2 μm).

Accordingly, to solve this problem, a stepper method, a scanner method, a holographic lithography method and the like were developed. However, these methods need complicated and sophisticated equipment and incur high expenses. Further, the methods have a limit in view of the fact that an area which can form a pattern is limited. That is, the conventional lithograph method is basically limited to implement nonoscale fine patterns due to the problems such as a limitation of equipment or a process property. More specifically, upon the use of the conventional lithography technology, it would be difficult to implement nanoscale patterns which are uniformly formed throughout a large area of more than 8 inch.

According to the aforesaid problems, a method of forming a porous metal thin film using a porous template made of a metal material as disclosed in Korean Laid-Open Patent Publication No. 2011-0024892, and forming nano patterns using the porous metal thin film as a catalyst was suggested. The method was problematic in that because the porous template should be prepared in advance, it is inconvenient to use the method, and because a catalyst growth method is used, nano patterns can be formed at only desired regions. Moreover, it was problematic that the nano patterns cannot be formed on a transparent substrate.

PRIOR ART REFERENCES (Patent Reference 1) Korean Laid-Open Patent Publication No. 10-2011-0024892

DISCLOSURE OF INVENTION

Technical Problem

Accordingly, the present invention has been made keeping in mind the above problems occurring in the related art. An aspect of the present invention provides a transparent substrate having a nano pattern and a method of manufacturing the same, which enables the nano pattern to be easily formed on the transparent substrate and has the nano pattern applicable to a large sized substrate by forming a resin layer made of transparent material on a transparent substrate; forming at least one or more unit pattern parts composed of a first pattern area and a second pattern area in which a plurality of grid patterns are formed, and a protrusion pattern formed between the first pattern area and the second pattern area, on the resin layer; and forming a nanoscale metal layer on the protrusion pattern.

Solution to Problem

According to an aspect of the present invention, there is provided a method of manufacturing a transparent substrate having a nano pattern, including: forming a resin layer made of a transparent material on a transparent substrate; forming a first pattern area and a second pattern area in which a plurality of grid pattern are formed, respectively, and at least one or more unit pattern parts composed of a protrusion pattern formed between the first pattern area and the second pattern area, on the resin layer; and forming a nanoscale metal layer on the protrusion pattern.

According to another aspect of the present invention, there is provided a transparent substrate having a nano pattern according to the present invention, including: a transparent substrate; a resin layer which is formed on the transparent substrate and is made of a transparent material; at least one or more unit pattern layers which are formed on the resin layer; a nanoscale metal layer which is formed on the unit pattern layers, wherein the unit pattern layers are composed of: a first and a second pattern areas in which a plurality of grid patterns are formed; and a protrusion pattern formed between the first pattern area and the second pattern area, wherein the metal layer is formed on the protrusion pattern.

Advantageous Effects of Invention

According to the present invention, it is advantageous that the nanoscale grid patterns can be uniformly formed throughout a wide area of the transparent substrate.

Also, according to the present invention, it is advantageous that the nanoscale metal layer as well as the aforesaid grid patterns can be also uniformly formed on the transparent substrate, thereby enabling the transparent substrate having electrical conductivity equal to ITO to be provided at a low cost.

In addition, the master mold used in the present invention is recyclable until it is damaged, causing economical advantages such as the reduction of a raw material charge and a production cost.

BRIEF DESCRIPTION OF DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

MODE FOR THE INVENTION

Exemplary embodiments according to the present invention will now be described more fully hereinafter with reference to the accompanying drawings. The exemplary embodiments of the present invention may, however, be embodied in many different forms and should not be construed as limited to the embodiments set forth herein. Rather these example embodiments are provided so that this disclosure will be thorough and complete, and will fully convey the scope of the invention to those skilled in the art. Furthermore, when it is determined that specific descriptions regarding publicly known relevant functions or configurations may unnecessarily be beside main points of the present invention, corresponding descriptions are omitted. It will be further understood that terms used herein should be interpreted as having a meaning that is consistent with their meaning in the context of this specification. With regard to the elements which perform similar functions and operations, like numbers refer to like elements through the specification.

Figure 1:
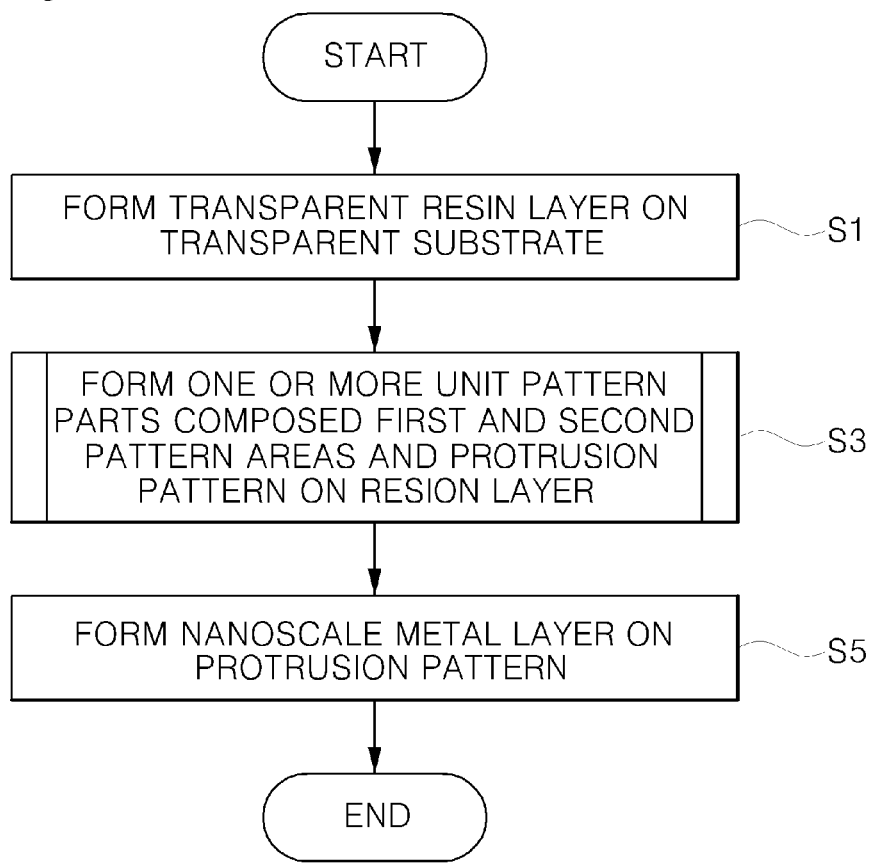
FIG. 1 and FIG. 2 are flow charts showing the order of a method of manufacturing a transparent substrate having a nano pattern according to the present invention.
Figure 2:
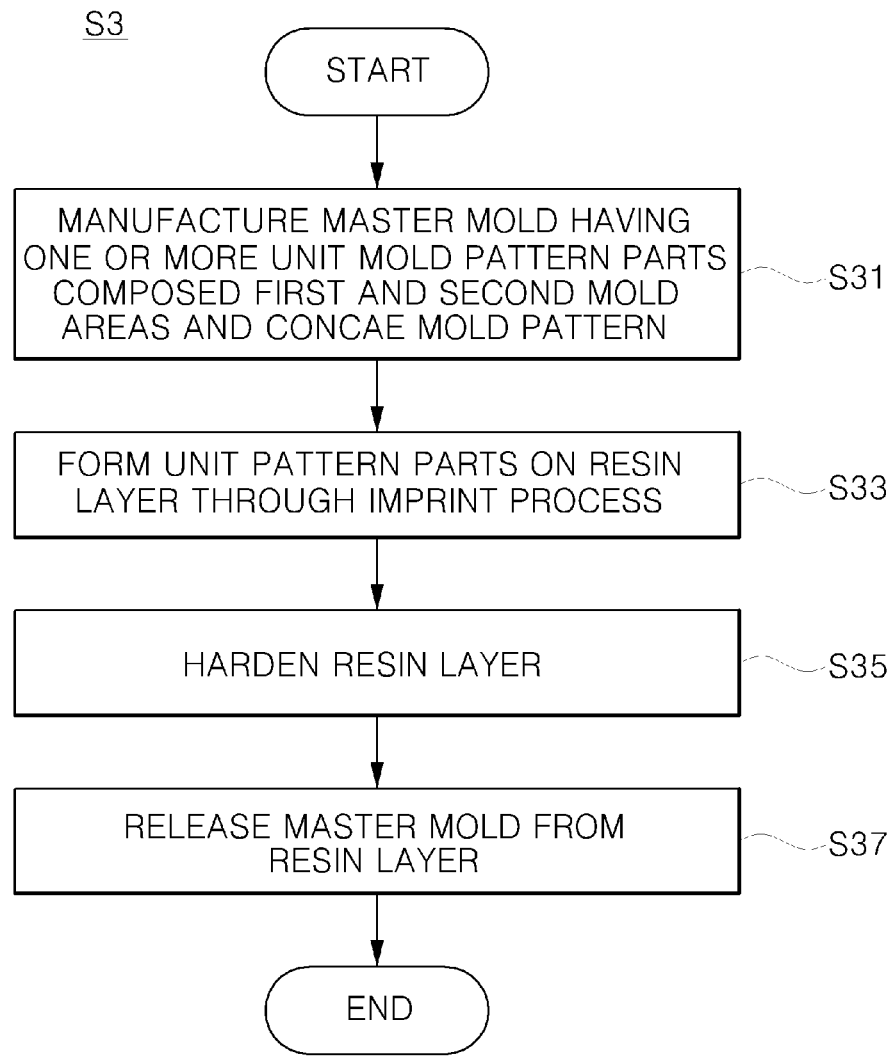

FIG. 1 and FIG. 2 are flow charts showing the order of a method of manufacturing a transparent substrate having a nano pattern according to the present invention.

Referring to FIG. 1 and FIG. 2, a method of manufacturing a transparent substrate having a nano pattern according to the present invention may include: forming a resin layer made of a transparent material on a transparent substrate (S1); forming at least one or more unit pattern parts, which are composed of a first and a second pattern areas in which a plurality of grid patterns are formed, and a protrusion pattern formed between the first pattern area and the second pattern area, on the resin layer (S3); and forming a nanoscale metal layer on the protrusion pattern (S5).

A material of the transparent substrate in used in step S1 may use glass, quartz, a polymer made of a transparent material, for example, publicly known polymer materials such as PET (polyethylene terephthalate), PC (polycarbonate), PI (polyimide). In addition to this, various flexible substrate may be used. The material is not limited.

After the transparent substrate is prepared, a resin layer is formed by applying a resin made of a transparent material to the transparent substrate. At this time, the resin may use a thermosetting polymer or a photo curable polymer. Meanwhile, to improve a bonding ability between the resin layer and the transparent substrate, the resin layer may be also formed by coating the transparent substrate with an adhesive before applying the resin, and thereafter applying the resin to the transparent substrate.

After step S1, at least one or more unit pattern parts, which are composed of a first pattern area and a second pattern area in which a plurality of grid patterns are formed, respectively, and a protrusion pattern formed between the first pattern area and the second pattern area, is formed on the resin layer (S3). Specially, step S3 may be performed as described below.

First, a master mold is produced (S31), the master mold having at least one or more unit mold pattern parts, which are composed of the first mold pattern area and the second mold pattern area in which a plurality of grid mold patterns are formed respectively, and a concave mold pattern formed between the first mold pattern area and the second mold pattern area.

The plurality of nanoscale grid mold patterns are first formed on an original material of the master mold using a space lithography process, for example, "a method of manufacturing a nanoscale pattern having a large area" as described in Korean patent application No. 10-2010-0129255. The master mold of the present invention may be produced by forming a concave mold pattern to divide a first mold pattern area and a second mold pattern area and forming one or more unit mold pattern parts. At this time, specifically, the formation method of the concave mold pattern may be performed by an electron-beam lithography process. However, the present invention is not limited to this.

Meanwhile, a width of the first mold pattern area or the second mold pattern area may be formed in a range of 50 to 100 nm. A width of concave mold pattern may be formed in a range of 200 to 1000 nm. The master mold produced by this method is not disposable, but is able to use until it is damaged. Furthermore, the master mold can continue to use at an imprinting process, causing economical advantages such as the reduction of a raw material charge and a production cost.

Then, the master mold produced in step S31 is arranged in an upper part of the resin layer, and one or more unit pattern parts corresponding to one or more unit mold pattern parts are formed on the resin layer through an imprinting process for pressurizing the resin layer (S33). Here, the unit pattern parts mean a structure including the first pattern area corresponding to the first mold pattern area, the second pattern area corresponding to the second mold pattern area, and the protrusion pattern unit corresponding to the concave mold pattern. The plurality of grid patterns corresponding to the plurality of grid mold patterns are provided in the first pattern area and the second pattern.

A process of hardening the resin layer is performed (S35). At this time, in a case where the resin layer is made of a thermosetting polymer, the resin layer is hardened by applying heat thereto. In a case where the resin layer is a photo curable polymer, the resin layer is hardened by irradiating ultraviolet rays thereto. Thereafter, step S3 of the present invention may be conducted by releasing the master mold from the resin layer (S37).

Then, in step S5, the nanoscale metal layer is formed on the protrusion pattern of the resin layer.

More specifically, a metal is first deposited on the grid patterns and the protrusion pattern. At this time, the deposited metal may use any one of Al, Cr, Ag, Cu, Ni, Co and Mo or an alloy thereof. However, the present invention should not be limited to this. In addition to this, other metals may be appropriately used as need. Also, the deposition method of the metal may use at least one method of a sputtering method, a chemical vapor deposition method, and an evaporation method. However, this is only one example. In addition to the methods, all deposition methods, which have been developed and commercialized or can be embodied according to future technical development, may be used.

Meanwhile, a height of depositing the metal may be formed to be more than a pitch value of the grid patterns, and the metal may be uniformly deposited on each grid pattern and the protrusion pattern. This is intended to easily remove the metal formed on the grid patterns at an etching process later.

After the metal is deposited, a wet etching process is performed thereon, so isotropic etching is performed at exposed three sides of the metal. Thus, the metal deposited on the grid patterns is etched, or a part bonded to the grid patterns is peeled off. Consequently, the metal deposited on the grid patterns is removed, and the metal on the protrusion pattern remain so as to form the metal layer. The reason why the metal deposited on the grid patterns is removed and the metal on the protrusion pattern remains so as to form the metal layer is because a contact area between the metal deposited on the grid patterns and an etching solution used during the wet etching process is more than the metal deposited on the protrusion pattern. Thus, the transparent substrate having the nano pattern of the present invention, including the nano pattern and nanoscale metal layer may be produced.

According to the present invention, as the wet etching process is used, the process can be performed even at room temperature, and as the manufacturing process of the master mold can be performed separately, flexible processes can be secured. Furthermore, the master mold is available until it is damaged, causing the reduction of a raw material charge and a production cost.

Also, according to the present invention, the nano patterns may be uniformly implemented throughout the wide area of the transparent substrate, and the nanoscale metal layer may be also uniformly formed on the transparent substrate. Thus, it is advantageous that the transparent substrate having electrical conductivity equal to ITO can be provided at a low cost, and an Ag mesh which is emerging as a substitute for the ITO can be produced as a nanoscale pattern. Accordingly, the present invention can be utilized in various fields such as a touch panel, a liquid crystal device, a solar cell and the like.

FIG. 3 through FIG. 9 are the exemplary views of processes illustrating roughly the manufacturing processes of a transparent substrate having a nano pattern according to the present invention.

Figure 3:
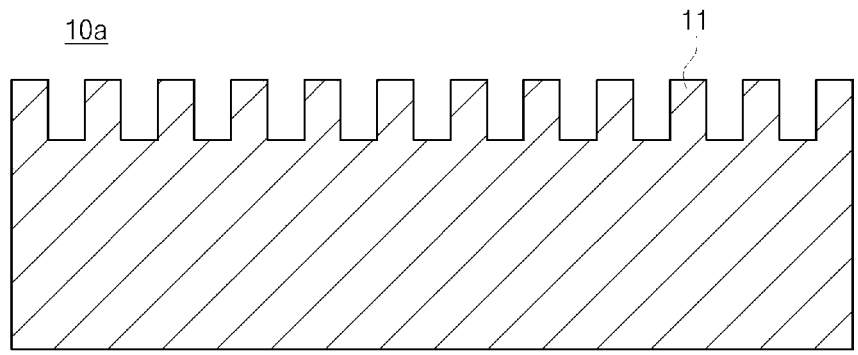
FIG. 3 through FIG. 9 are the exemplary views of processes illustrating roughly the manufacturing processes of a transparent substrate having a nano pattern according to the present invention.

Referring to FIG. 3 through FIG. 9, as illustrated in FIG. 3, a structure 10a in which the plurality of nanoscale grid mold patterns 11 on an upper par thereof are formed is produced. At this time, the space lithograph process may be used as a method of forming the grid mold pattern 11. This is the same as described in the explanation of FIG. 2.

Figure 4:
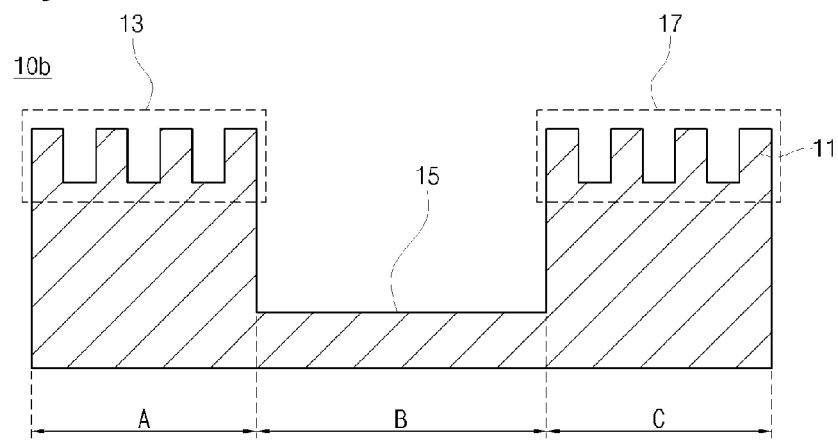
Figure 5:
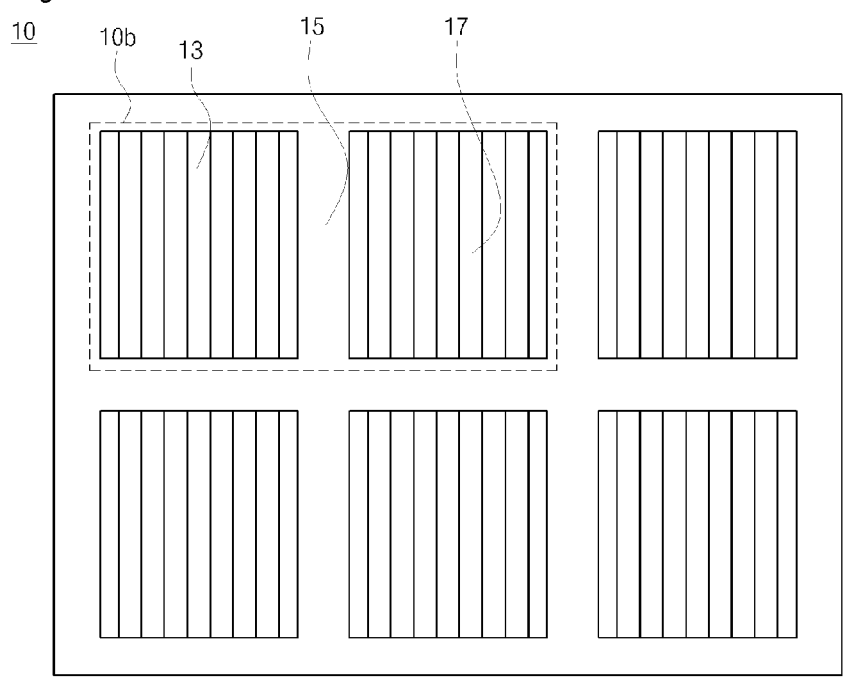

Thereafter, as illustrated in FIG. 4 and FIG. 5, a master mold 10 having at least one or more unit mold pattern parts 10b are produced by patterning the structure 10a as illustrated in FIG. 3 through an electron-beam lithography process. At this time, the unit mold pattern parts 10b are composed of a first mold pattern area 13, a second mold pattern area 17, and a concave mold pattern 15 formed between the first mold pattern area 13 and the second mold pattern area 17. The mold pattern area 13 and the second mold pattern area 17 have a plurality of grid mold pattern 11.

Here, a width (B) of the concave mold pattern 15 is formed to be wider than a width (A) of the first mold pattern area 13 or a width (C) of the second mold pattern area 17. More specifically, the width (B) of the concave mold pattern 15 may be formed in the range of 200 to 1000 nm. The width (A) of the first mold pattern area 13 or the width (C) of the second mold pattern area 17 may be formed in the range of 50 to 100 nm. However, the present invention is not limited to this. Also, a depressed depth of the concave mold pattern 15 may be formed to be deeper than a height of the grid mold pattern 11.

Figure 6:
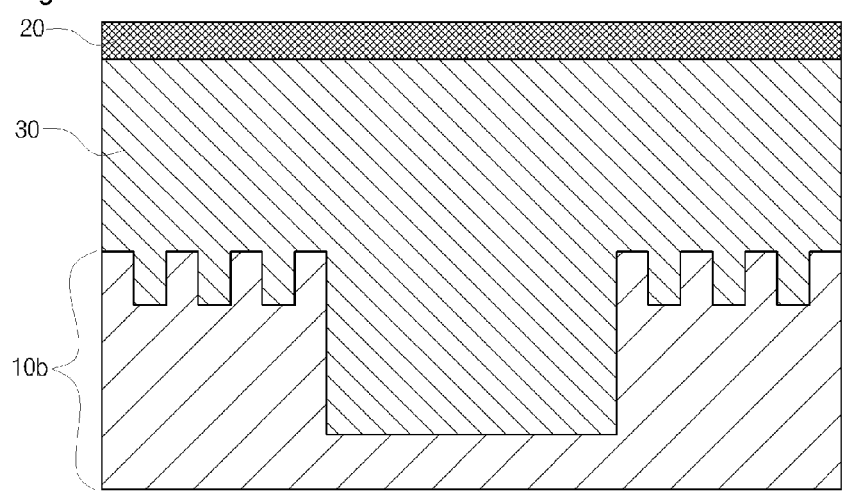
Figure 7:
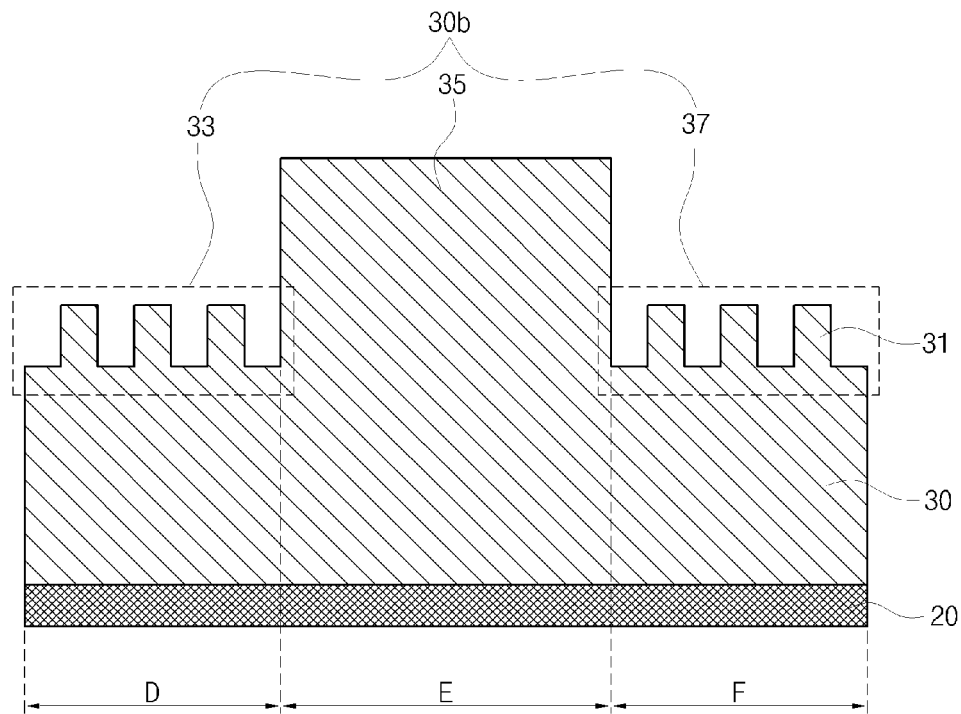

Then, as illustrated in FIG. 6, the imprinting process for pressurizing the resin layer 39 formed on the transparent substrate 20 using the master mold (10 of FIG. 5), in which one or more unit mold pattern parts 10b are formed, is conducted. The detailed explanation on the transparent substrate 20 and the resin layer 30 is the same as described in the explanation of FIG. 1 and FIG. 2, and thus is omitted. The master mold (10 of FIG. 5) is released from the resin layer 30 after applying a photo curing process or a heat curing process, as illustrated in FIG. 7, so that one or more unit pattern parts 30b corresponding to the unit mold pattern parts (10b of FIG. 5 and FIG. 6) may be formed on the resin layer 30. Here, the unit pattern parts 30b are composed of the first pattern area 33, the second patter area 37, and the protrusion pattern 35 formed between the first pattern area 33 and the second pattern area 37. The first pattern area 33, and the second patter area 37 have the plurality of grid pattern 31.

Here, a width (E) of the protrusion pattern 35 may be formed to be wider than a width (D) of the first pattern area or a width (F) of the second pattern area 37. More specifically, the width (E) of the protrusion pattern 35 may be formed in a range of 200 to 1000 nm. The width (D) of the first pattern area 33 or the width (F) of the second pattern area 37 may be formed in a range of 50 to 100 nm. However, the present invention is not limited to this. Also, a height of the protrusion pattern 35 is formed to be higher than a height of the grid patterns 31.

Figure 8:
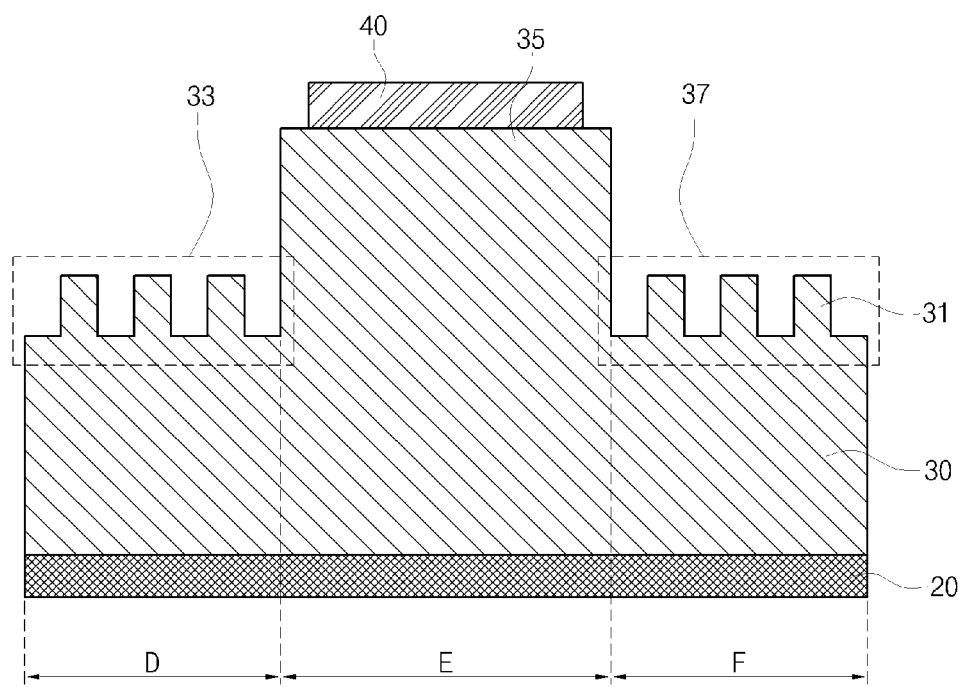
Figure 9:
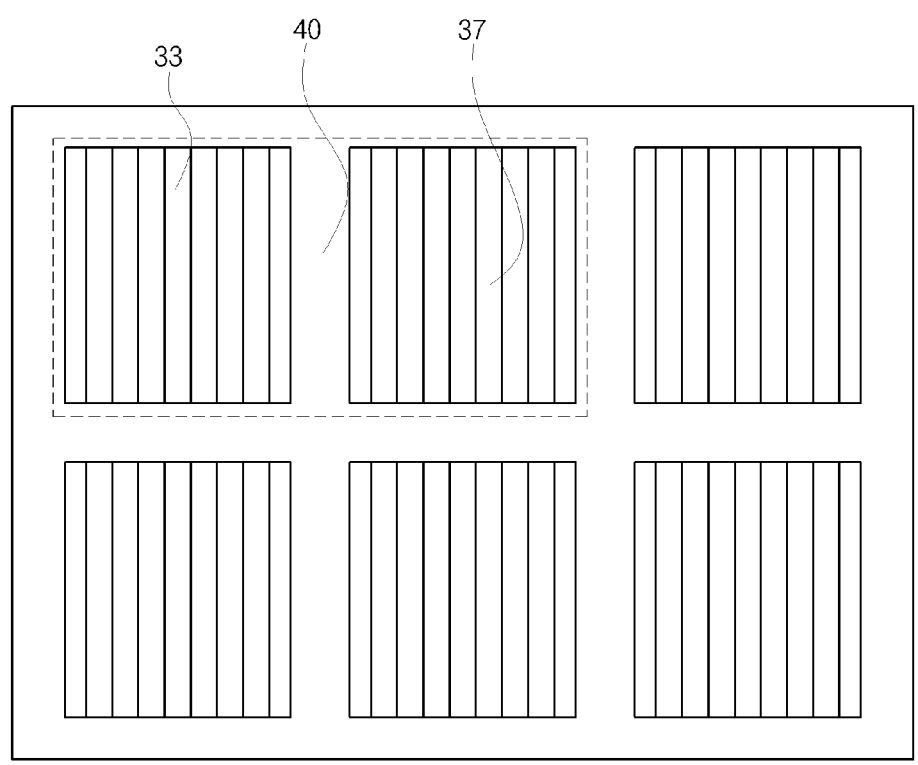

Then, the metal is deposited on the grid patterns 31 and the protrusion pattern 35, and the metal deposited on the grid patterns 31 is removed through the wet etching process, so that the nanoscale metal layer 40 may be formed on the protrusion pattern 35, as illustrated in FIG. 8. Thus, the transparent substrate having the nano pattern with a large area as illustrated in FIG. 9 can be obtained.

As previously described, in the detailed description of the invention, having described the detailed exemplary embodiments of the invention, it should be apparent that modifications and variations can be made by persons skilled without deviating from the spirit or scope of the invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims and their equivalents.

The invention claimed is:

1. An electrically conductive and light transmissive layer, comprising:
   a transparent substrate;
   a transparent layer provided over the transparent substrate and having first and second surfaces which are opposing surfaces, the first surface being provided over the transparent substrate;
   first and second pattern areas formed in second surface of the transparent layer, a pattern of the first and second pattern areas being formed by a plurality of recesses;
   a first protrusion extending from the second surface such that the protrusion has a different height from and provided between the first and second pattern areas, the height being a distance from the first surface to the second surface in a direction of the protrusion; and
   a metal layer formed over the protrusion, wherein an electrical conductivity of the electrically conductive and light transmissive layer is equal to indium tin oxide (ITO).

2. An electrically conductive and light transmissive layer of claim 1, wherein the height of the first protrusion is greater than a height of the first and second pattern areas.

3. An electrically conductive and light transmissive layer of claim 1, wherein a second protrusion is formed between adjacent recesses of the first pattern area or the second pattern area, the second protrusion having a width smaller than a width of the first protrusion.

4. An electrically conductive and light transmissive layer of claim 1, wherein a width of the first protrusion is between 200 to 1000 nm.

5. An electrically conductive and light transmissive layer of claim 1, wherein the metal layer includes any one of Al, Cr, Ag, Cu, Ni, Co, and Mo or an alloy thereof.

6. An electrically conductive and light transmissive layer of claim 1, wherein the transparent layer is composed of a thermosetting polymer or a photo curable polymer.

7. An electrically conductive and light transmissive layer for a display device, comprising:
   a transparent substrate;
   a transparent layer provided over the transparent substrate, the transparent layer having first and second surfaces, which are opposing surfaces, the first surface facing the transparent substrate, the second surface having a plurality of protrusions extending in different directions such that the plurality of first protrusions intersect to form recess regions on the second surface, and the recess regions having a plurality of second protrusions, the second protrusions having a height and a width less than the first protrusions; and
   at least one metallic wiring layer formed on the plurality of first protrusions including at locations where the first protrusions intersect, wherein an electrical conductivity of the electrically conductive and light transmissive layer is equal to indium tin oxide (ITO).

8. The electrically conductive and light transmissive layer of claim 7, wherein the transparent layer is made of resin material.

9. The electrically conductive and light transmissive layer of claim 8, wherein the resin material is one of a thermosetting polymer or a photo-curable polymer, the polymer being one of PET, PC and PI.

10. The electrically conductive and light transmissive layer of claim 7, wherein the substrate is at least one of glass or quartz.

11. The electrically conductive and light transmissive layer of claim 7, wherein the plurality of first protrusions form a mesh layout on the second surface of the transparent layer.

12. The electrically conductive and light transmissive layer of claim 7, wherein the plurality of first protrusions comprises a first group of protrusions extending in a first direction and a second group of protrusions extending in a second direction, the first and second directions being different directions.

13. The electrically conductive and light transmissive layer of claim 12, wherein the first and second directions are perpendicular to each other such that the recess regions have a rectangular shape.

14. The electrically conductive and light transmissive layer of claim 7, wherein a recess is provided between adjacent second protrusions to form a pattern of protrusions and recesses.

15. The electrically conductive and light transmissive layer of claim 7, wherein the plurality of first protrusions comprises a first group of protrusions extending in a first direction and a second group of protrusions extending in a second direction, the first and second directions being different directions, the plurality of second protrusions extending in the first direction of the first group of protrusions.

16. The electrically conductive and light transmissive layer of claim 7, wherein the at least one metallic wiring layer comprises at least one of Al, Cr, Ag, Cu, Ni, Co or Mo.

17. The electrically conductive and light transmissive layer of claim 7, wherein a width of a first protrusion is 200-1000 nm.

18. The electrically conductive and light transmissive layer of claim 7, wherein each of the plurality of first protrusions has a width wider than a width of each of the plurality of second protrusions.

19. The electrically conductive and light transmissive layer of claim 7, wherein each of the first and second protrusions has a rectangular shape.

* * * * *